(12) United States Patent
Jensen et al.

(10) Patent No.: US 12,396,097 B2
(45) Date of Patent: Aug. 19, 2025

(54) SUBSTRATES WITH CONTINUOUS SLOT VIAS

(71) Applicant: Micron Technology, Inc., Boise, ID (US)

(72) Inventors: Travis M. Jensen, Boise, ID (US); Walter L. Moden, Boise, ID (US); Stephen F. Moxham, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 17/899,477

(22) Filed: Aug. 30, 2022

(65) Prior Publication Data

US 2024/0074055 A1 Feb. 29, 2024

(51) Int. Cl.
| | |
|---|---|
| H05K 1/11 | (2006.01) |
| H01L 21/48 | (2006.01) |
| H01L 23/48 | (2006.01) |
| H01L 23/498 | (2006.01) |
| H05K 3/00 | (2006.01) |
| H05K 3/40 | (2006.01) |
| H01L 23/00 | (2006.01) |

(52) U.S. Cl.
CPC .......... *H05K 1/116* (2013.01); *H01L 21/4846* (2013.01); *H01L 23/481* (2013.01); *H01L 23/49827* (2013.01); *H01L 23/49838* (2013.01); *H05K 3/0014* (2013.01); *H05K 3/0047* (2013.01); *H05K 3/4038* (2013.01); *H01L 24/16* (2013.01); *H01L 2224/16227* (2013.01); *H05K 2201/09563* (2013.01); *H05K 2201/09636* (2013.01)

(58) Field of Classification Search
CPC .... H05K 1/116; H05K 3/0014; H05K 3/0047; H05K 3/4038
See application file for complete search history.

(56) References Cited

U.S. PATENT DOCUMENTS

| | | | |
|---|---|---|---|
| 10,244,629 B1* | 3/2019 | Balasubramanian | H05K 1/113 |
| 2015/0114706 A1* | 4/2015 | Rose | H05K 3/20 174/262 |
| 2016/0150645 A1* | 5/2016 | Gailus | H05K 1/0219 174/262 |
| 2017/0150594 A1* | 5/2017 | Jones | H05K 1/0251 |
| 2018/0070439 A1* | 3/2018 | Charbonneau | H05K 1/115 |
| 2020/0253037 A1* | 8/2020 | Marin | H05K 1/0228 |
| 2021/0092830 A1* | 3/2021 | Yin | H05K 1/116 |

* cited by examiner

Primary Examiner — Sherman Ng
(74) Attorney, Agent, or Firm — Dorsey & Whitney LLP

(57) ABSTRACT

Substrates with continuous slot vias are disclosed herein. In one embodiment, a substrate comprises a first design layer, a second design layer, and an intermediary layer between the first and second design layers. The substrate further includes first and second signaling vias extending vertically through the intermediary layer between the first and second design layers. The first and second signaling vias route first and second data signals, respectively, between the first and second design layers. The substrate further includes a slot via that is positioned between the first and second signaling vias within the intermediary layer and extends laterally within the intermediary layer along a path that passes between the first signaling via and the second signaling via. The slot via can have a continuous shape such that the slot via shields the first and second data signals on the first and second signaling vias from crosstalk with one another.

20 Claims, 3 Drawing Sheets

SUBSTRATES WITH CONTINUOUS SLOT VIAS

TECHNICAL FIELD

The present disclosure generally relates to substrates with continuous slot vias, such as for semiconductor systems and/or devices. For example, several embodiments of the present technology relate to substrates with continuous slot vias for shielding data signals transmitted along signaling vias.

BACKGROUND

Many substrates (e.g., printed circuit boards (PCBs), package substrates, interconnectors, etc.) are formed of multiple layers. For example, a substrate can include one or more signal layers (also called design or metallization layers), one or more plane layers (e.g., ground planes, power planes, etc.), and/or one or more intermediary layers or dielectric spacers. The signal layers can include traces configured to route data signals to or from other devices or circuits either incorporated on or into the substrate, or externally connected to the substrate. The plane layers can be configured to ground or distribute power to the devices or circuits. The intermediary layers (e.g., substrate cores, prepreg layers, etc.) can be used to structurally bond signal layers and/or plane layers to one another; electrically isolate and/or physically separate the signal layers and/or the plane layers from one another; and/or provide structural rigidity to the substrate.

Continuing with the above example, the substrate can further include vias formed in the intermediary layers to electrically couple components of the different layers of the substrate to one another. For example, a substrate can include a via formed in a substrate core or prepreg layer to electrically couple a trace of a first signal layer to a trace of a second signal layer of the substrate. In this manner, a data signal can be routed from the first signal layer to the second signal layer, or vice versa. As another example, the substrate can include a via formed in a substrate core or prepreg layer to facilitate routing power and/or ground signals (a) through the substrate core or prepreg layer and (b) between various layers of the substrate.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

The following disclosure describes substrates with continuous slot vias. For example, several embodiments described herein are directed to substrates having slot vias positioned between adjacent (e.g., immediately adjacent) design-layer-to-design-layer signaling vias. The slot vias can be configured to route ground signals or power signals through one or more layers of the substrates, or can be left floating in some embodiments. The signaling vias are configured to route data signals through at least one layer of each of the substrates. As data signals are routed along adjacent signaling vias in a substrate, a slot via of the present technology can be used to shield the data signals from crosstalk with one another. Such technology can be used in a variety of applications, such as in graphics double data rate (GDDR) memory packages or in other applications in which vias are employed to transition data signals from layer to layer in a substrate and the data signals are susceptible to cross-talk.

As used herein, the term "slot via" refers to a via that is elongated in one lateral dimension relative to another lateral dimension by at least a specified factor (e.g., 1.1 times, 1.25 times, 1.5 times, 2 times, 2.5, times, 3 times, or more). For example, a slot via can include a length that is at least twice as large as its width.

For the sake of clarity and understanding, substrates of the present technology are primarily discussed in detail below with respect to PCBs. In other embodiments, substrates of the present technology can include package substrates, interconnectors, interposers, dielectric spacers, redistribution structures, semiconductor dies (e.g., logic dies, memory dies), and/or the like.

As discussed above, a substrate can be formed of multiple layers and can include vias to facilitate routing data signals, ground signals, and/or power signals between different layers of the substrate. For example, a substrate can include a signaling via formed through a substrate core or prepreg layer to electrically couple a trace of a first design layer to a trace of a second design layer. In this manner, a data signal can be routed from the first design layer of the substrate, through the substrate core or prepreg layer, and to the second design layer.

Figure 1:
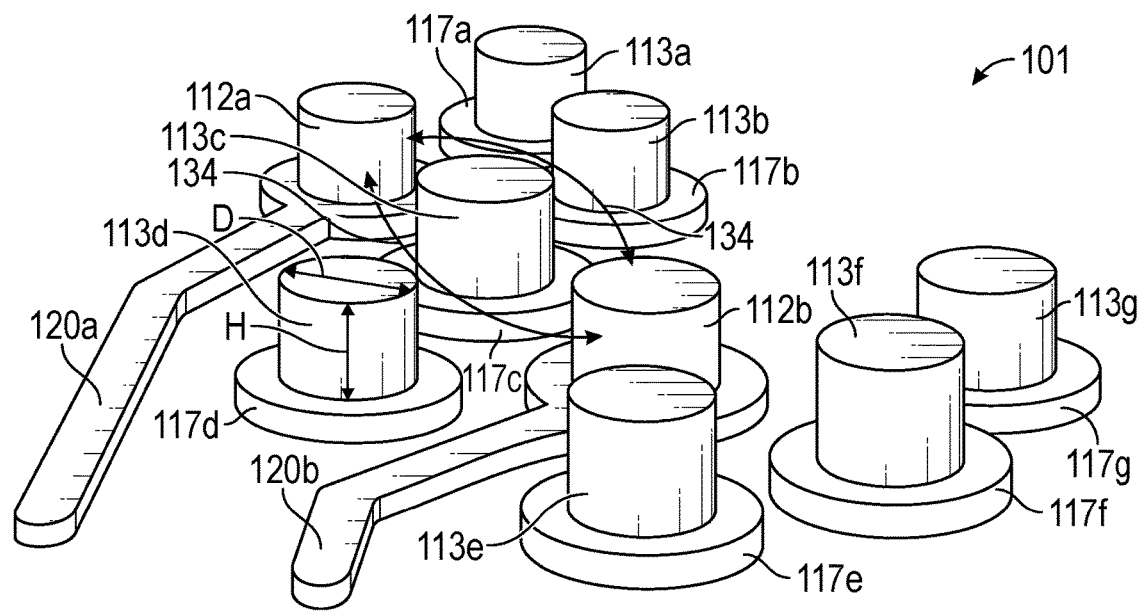
FIG. 1 is a partial perspective view of a substrate including hole vias positioned between signaling vias.

As transmission speeds increase and the data signal is routed along the signaling via, the data signal can become susceptible to crosstalk with other data signals being routed between various layers of the substrate. Thus, power and/or ground vias can be formed in the substrate core or prepreg layer at locations between neighboring signaling vias, thereby shielding data signals transmitted along the neighboring signaling vias from crosstalk with one another. For example, FIG. 1 is a partial perspective view of a substrate 101. More specifically, FIG. 1 illustrates two traces 120 (identified individually as first trace 120*a* and second trace 120*b*) electrically coupled to corresponding signaling vias 112 (identified individually as first signaling via 112*a* and second signaling via 112*b*). The traces 120 are formed in or on a signal layer of the substrate 204, and the signaling vias 112 are formed in an intermediary layer (e.g., a substrate core or prepreg layer) of the substrate 101. The signaling vias 112 are used to route data signals from the traces 120 to traces or other electrical components (not shown) of another signal layer (not shown) of the substrate 101.

The substrate 101 of FIG. 1 further includes a plurality of ground or power vias 113 (identified individually as ground/power vias 113*a*-113*g*) that are electrically coupled to corresponding capture pads 117 (identified individually as capture pads 117a-117g). The ground/power vias 113 are also formed in the intermediary layer of the substrate and electrically couple (a) the capture pads 117 to (b) one or more a ground planes (not shown), one or more power planes (not shown), and/or one or more electrical connectors of another layer of the substrate 101. The ground/power vias 113 are used to route ground signals and/or power signals between various layers of the substrate 101.

As shown, the ground/power vias 113 are positioned between the signaling vias 112 to provide shielding to the signaling vias 112 and reduce the risk of crosstalk between data signals routed along the signaling vias 112. Each of the ground/power vias 113 illustrated in FIG. 1, however, are right circular cylindrical vias (having a diameter D and a height H) that are separated from one another. Therefore, there is intrinsic space or gaps between immediately adjacent ones of the ground/power vias 113. Stated another way, the ground/power vias 113 are not continuous with one another from the perspective of the signaling vias 112. As a result, data signals routed along the signaling vias 112 are left vulnerable to crosstalk with one another through the intrinsic gaps (as shown by arrows 134 in FIG. 1), especially as transmission speeds increase.

Figure 2A:
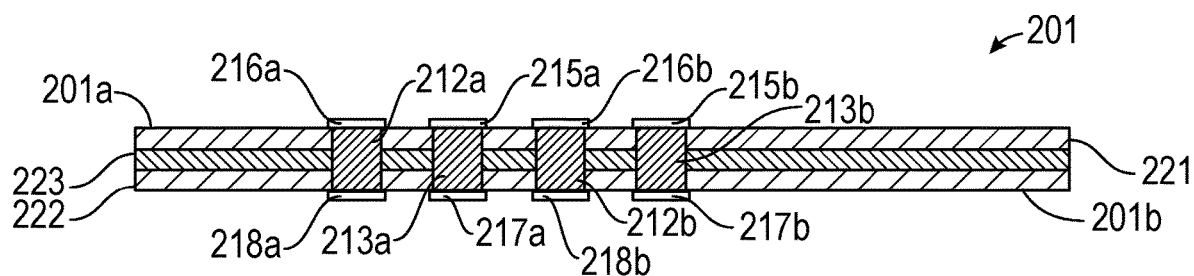
FIG. 2A is a partially schematic, cross-sectional side view of a substrate configured in accordance with various embodiments of the present technology.
Figure 2B:
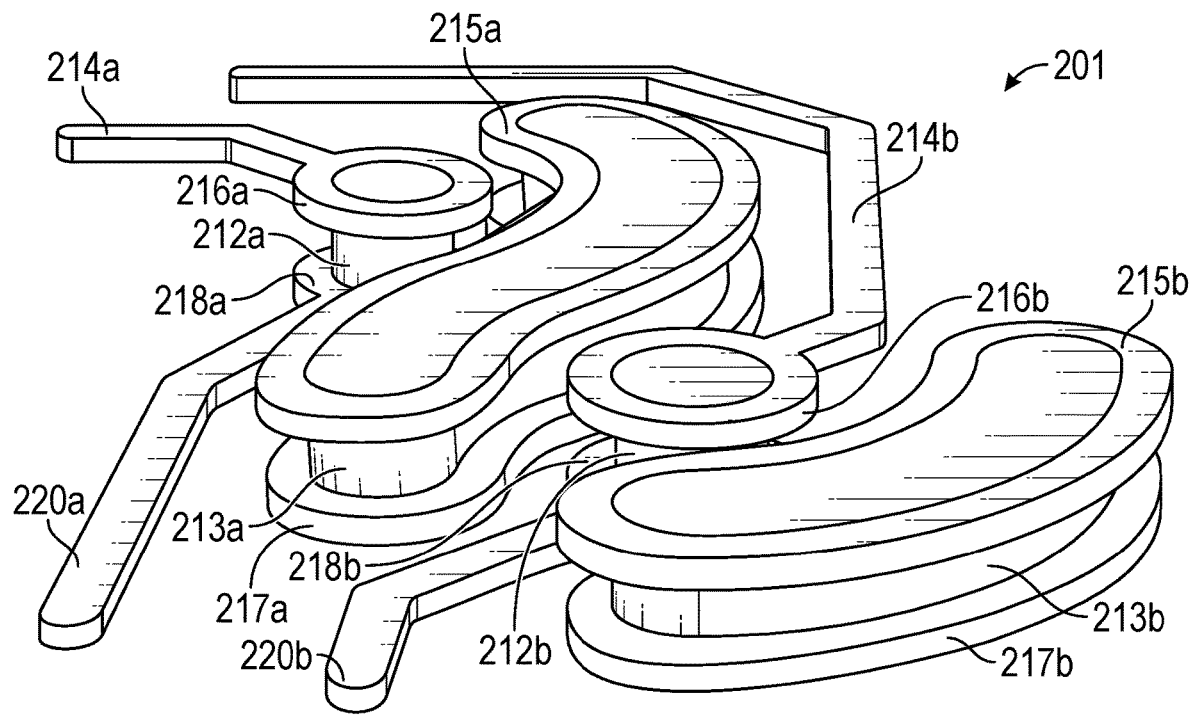
FIGS. 2B and 2C are partial perspective views of the substrate of FIG. 2A.
Figure 2C:
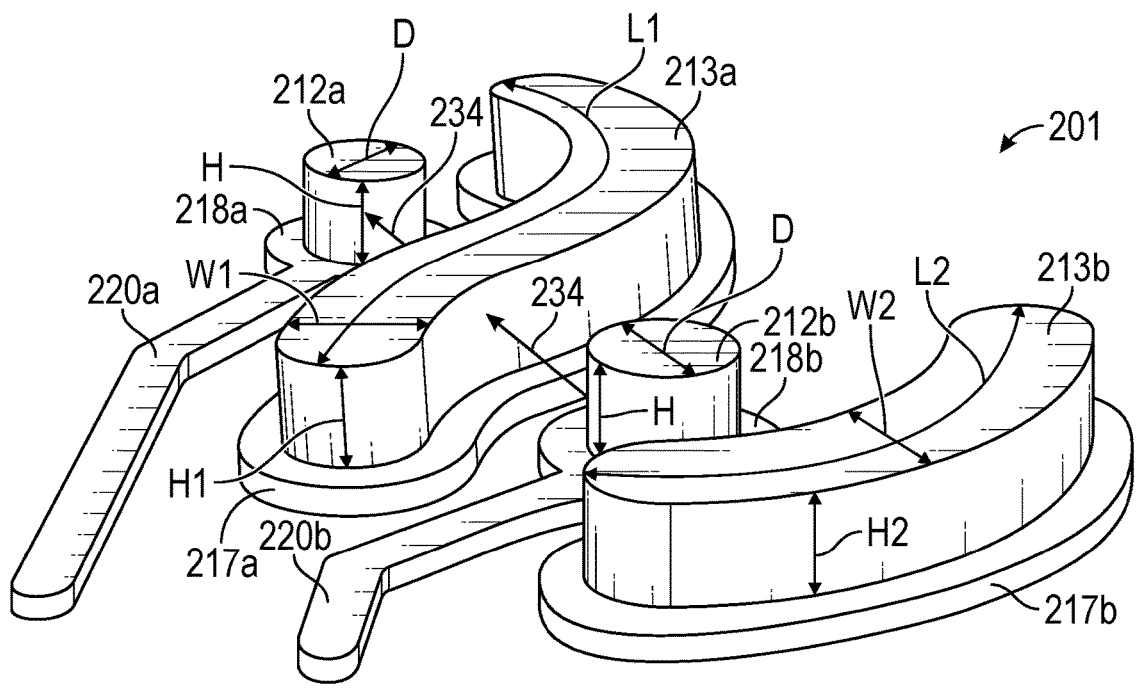

To address these concerns, substrates of the present technology include continuous slot vias (as shown in FIGS. 2B and 2C, and discussed in greater detail below) positioned between neighboring (e.g., adjacent, immediately adjacent) signaling vias. The slot vias can be formed in continuous troughs (e.g., trenches, slots, etc.) in one or more layers of a substrate, rather than in a series of holes that are spaced apart from one another. As such, a continuous slot via of the present technology can lack the intrinsic space or gaps that exists between adjacent and/or immediately adjacent hole vias 113 of FIG. 1. Therefore, a continuous slot via of the present technology can better shield data signals from one another as the data signals are transmitted along neighboring signaling vias of a substrate. As a result, continuous slot vias are expected to reduce, minimize, and/or eliminate crosstalk between the data signals, even as transmission speeds increase.

Specific details of several embodiments of the present technology are described herein with reference to FIGS. 1-4. It should be noted that other embodiments in addition to those disclosed herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "horizontal," "upper," "lower," "top," "above," "left," "right," "up," "down," "below," and "bottom" can refer to relative directions or positions of features in the semiconductor devices in view of the orientation shown in FIGS. 1-4. For example, "bottom" and/or "below" can refer to a feature positioned closer to the bottom of a page than another feature. These terms, however, should be construed broadly to include semiconductor devices having other orientations, such as inverted or inclined orientations where top/bottom, over/under, above/below, up/down, and/or left/right can be interchanged depending on the orientation.

FIG. 2A is a partially schematic, cross-sectional side view of a substrate 201 configured in accordance with various embodiments of the present technology. The substrate 201 can be a printed circuit board (PCB), a package substrate, an interposer, an interconnector, a dielectric spacer, a redistribution structure, a semiconductor die, or the like. For the sake of clarity and example, the substrate 201 is discussed and described in detail below as a PCB.

As shown, the substrate 201 includes a first design layer 221, a second design layer 222, and an intermediary layer 223 positioned between the first design layer 221 and the second design layer 222. In some embodiments, the intermediary layer 223 can include a substrate core, prepreg, dielectric, or another suitable layering or material. The intermediary layer 223 can bond the first design layer 221 to the second design layer 222. In these and other embodiments, the intermediary layer 223 can physically separate and/or electrically isolate the first design layer 221 from the second design layer 222. In these and still other embodiments, the intermediary layer 223 can provide structural rigidity and/or flexibility to the substrate 201.

Although shown with three layers in FIG. 2A, the substrate 201 can include additional layers in other embodiments of the present technology. For example, the substrate 201 can include one or more ground planes (not shown) and/or one or more power planes (not shown) in some embodiments. As another example, the substrate 201 can include one or more design layers and/or one or more intermediary layers, in addition to the first design layer 221, the second design layer 222, and the intermediary layer 223 shown in FIG. 2A. The one or more ground planes, power planes, additional design layers, and/or additional intermediary layers can be positioned above the first design layer 221, below the second design layer 222, between the first design layer 221 and the intermediary layer 223, and/or between the intermediary layer 223 and the second design layer 222.

The substrate 201 of FIG. 2A further includes a plurality of signaling vias 212 (identified individually as first signaling via 212a and second signaling via 212b) and a plurality of slot vias 213 (identified individually as first slot via 213a and second slot via 213b). The signaling vias 212 electrically couple electrical contacts 216 (identified individually as electrical contact 216a and electrical contact 216b) to corresponding electrical contacts 218 (identified individually as electrical contact 218a and electrical contact 218b). The electrical contacts 216 and 218 can be bond pads, bond fingers, traces, and/or other suitable electrical contacts or connectors. The electrical contacts 216 can be disposed or formed in or on the first design layer 221, and the electrical contacts 218 can be disposed or formed in or on the second design layer 222. In the illustrated embodiment, the electrical contacts 216 are disposed on the first design layer 221 (e.g., on a top face or surface 201a of the substrate 201), and the electrical contacts 218 are disposed on the second design layer 222 (e.g., on a bottom face or surface 201b of the substrate 201). As discussed in greater detail below, the electrical contacts 216 can be electrically coupled to one or more traces 214 (FIG. 2B) that extend through or across the first design layer 221, and/or the electrical contacts 218 can be electrically coupled to one or more traces 220 (FIGS. 2B and 2C) that extend through or across the second design layer 222. In operation, the signaling via 212a is configured to route data signals between the electrical contacts 216a and 218a, and the signaling via 212b is configured to route data signals between the electrical contacts 216b and 218b. In some embodiments, the signaling vias 212a and 212b can be immediately adjacent signaling vias to each other. For example, the signaling via 212a can be immediately adjacent the signaling via 212b in the substrate 201 such that there are no other signaling vias 212 in the substrate 201 that are (a) positioned between the signaling vias 212a and 212b and (b) positioned closer to one of the signaling via 212a and 212b than the other of the signaling vias 212a and 212b is positioned to the one.

The slot vias 213 electrically couple electrical contacts 215 (identified individually as electrical contact 215a and electrical contact 215b) to corresponding electrical contacts 217 (identified individually as electrical contact 217a and electrical contact 217b). The electrical contacts 215 and 217 can be bond pads, bond fingers, traces, and/or other suitable electrical contacts or connectors. For example, the electrical contacts 215 and/or the electrical contacts 217 can be capture pads. The electrical contacts 215 can be disposed or formed in or on the first design layer 221, and the electrical contacts 217 can be disposed or formed in or on the second design layer 222. In the illustrated embodiment, the electrical contacts 215 are disposed on the first design layer 221 (e.g., on the top surface 201a of the substrate 201), and the electrical contacts 217 are disposed on the second design layer 222 (e.g., on the bottom surface 201b of the substrate 201). Alternatively, the electrical contacts 215 and/or the electrical contacts 217 can be disposed or formed in or on another layer of the substrate 201, such as in or on the intermediary layer 223. In still other embodiments, the electrical contacts 215 and/or the electrical contacts 217 can be planes (e.g., ground or power planes) formed in and/or serving as a layer within the substrate 201.

In some embodiments, the electrical contacts 215 and 217 can be electrically coupled to ground or a power supply (e.g., via a connection external to the substrate 201, via a ground plane, via a power plane, etc.). In these embodiments, the slot via 213a is configured to route ground or power signals between the electrical contacts 215a and 217a, and the slot via 213b is configured to route ground or power signals between the electrical contacts 215b and 217b. Thus, the slot vias 213a and/or 213b can also be referred to herein as ground/power vias 213a and/or 213b, respectively (e.g., at least in embodiments in which the slot vias 213a and/or 213b, respectively, are used to route ground/power signals). In other embodiments, the slot via 213a and/or the slot via 213b can be left floating (e.g., such that it is not used to route an electrical signal between the corresponding electrical contacts 215 and 217). As discussed in greater detail below, the slot vias 213 are configured to shield data signals transmitted along the signaling vias 212 from crosstalk with one another.

FIGS. 2B and 2C are partial perspective views of the substrate 201 of FIG. 2A. For the sake of clarity and understanding, only the electrical conductors formed in or on the layers 221-223 of the substrate 201 are shown in FIGS. 2B, and FIG. 2C illustrates the substrate 201 as shown in FIG. 2B without the electrical conductors formed in or on the first signal layer 221.

Referring to FIGS. 2B and 2C together, the signaling vias 212 can have different shapes and/or dimensions than the slot vias 213. For example, as best shown in FIG. 2C, the signaling vias 212 can be right circular cylindrical vias having a diameter D (e.g., measured in a lateral direction that is parallel to the first signal layer 221 and/or the second signal layer 222) and a height H (e.g., measured in a vertical direction that is perpendicular to the first signal layer 221 and/or the second signal layer 222). A lateral cross section of the signaling vias 212 in a direction generally parallel to the first signal layer 221 and/or the second signal layer can be circular.

By contrast, as best shown in FIG. 2C, the slot via 213a and the slot via 213b are continuous slot (e.g., non-right circular cylindrical) vias having respective widths W1 and W2 (e.g., measured along a first general direction parallel to the first signal layer 221 and/or the second signal layer 222), respective heights H1 and H2 (e.g., measured along a general direction perpendicular to the first signal layer 221 and/or the second signal layer 222), and respective lengths L1 and L2 (e.g., measured along a second general direction parallel to the first signal layer 221 and/or the second signal layer 222 and different from the first general direction). In some embodiments, the slot vias 213 can be elongated in one lateral dimension relative to another lateral dimension by at least a specified factor. For example, the length L1 of the slot via 213a can be at least 1.1 times, 1.25 times, 1.5 times, 2 times, 2.5 times, 3 times, or more as great as the width W1 of the slot via 213a. As another example, width of a slot via 213 can be at least 1.1 times, 1.25 times, 1.5 times, 2 times, 2.5 times, 3 times, or more as great as a length of the slot via 213. The slot via 213a and the slot via 213b are continuous at least along their respective elongated dimension. In some embodiments, a lateral cross section of each of the slot vias 213 in a direction generally parallel to the first signal layer 221 and/or the second signal layer can be linear or curvilinear (e.g., arcuate, sinusoidal, etc.). In these and other embodiments, the cross sections can be non-circular, triangular, rectangular, pentagonal, hexagonal, octagonal, non-basic (e.g., other than circular, triangular, and rectangular), and/or irregularly shaped (e.g., in comparison to regular shapes). For example, a cross section of a slot via can be stadium shaped, and the stadium cross section can linearly or curvilinearly extend laterally within the intermediary layer 223.

As shown in FIG. 2C, the lengths L1 and L2 of the slot vias 213 are larger or elongated (e.g., span a greater distance end-to-end within the intermediary layer 223 (FIG. 2A) of the substrate 201) in comparison to the diameters D of the signaling vias 212 or the diameters D of the ground/power vias 113 of FIG. 1. Stated another way, the slot vias 213 can laterally extend continuously across or throughout the intermediary layer 223 and/or the substrate 201 (e.g., generally along an x-y plane) by an amount or distance greater than the signaling vias 212 and/or a collection of one or more of the ground/power vias 113 of FIG. 1. Thus, the slot vias 213 can have larger two-dimensional (e.g., area) and/or three-dimensional (e.g., volume) footprints than the signaling vias 212 and/or the right circular cylindrical hole ground/power vias 113 in some embodiments.

As shown in FIGS. 2B and 2C, the slot vias 213 are (a) positioned about the signaling vias 212 and (b) are sized and/or shaped to generally track (e.g., follow, trace, etc.) the signal traces 214 and/or 220 extending throughout and/or across the first signal layer 221 (FIG. 2A) and/or the second signal layer 222 (FIG. 2A), respectively, of the substrate 201. For example, the slot via 213a is positioned between the signaling vias 212a and 212b, with at least a portion of the slot via 213a intersecting a straight line extending between the signaling vias 212a and 212b. In addition, the slot via 213a is elongated and extends (e.g., continuously) along a path that passes between the signaling vias 212a and 212b. Furthermore, the slot via 213a is shaped to generally follow the directions that the traces 214 and 220 extend through or along the respective signal layers 221 and 222. In other words, the slot via 213a can be sized and/or shaped to generally match or correspond to (a) the shape and dimensions of the gap between the traces 214a and 214b in or on the first signal layer 221 of the substrate 201, (b) the shape and dimensions of the gap between the signaling via 212a and 212b in the intermediary layer 223 (FIG. 2A) of the substrate 201, and/or (c) the shape and dimensions of the gap between the traces 220a and 220b in or on the second signal layer 222 of the substrate 201. Similarly, the slot via 213b is positioned about the signaling via 212b (e.g., between the signaling via 212b and another signaling via (not shown) extending through the intermediary layer 223 of the substrate 201). In addition, the slot via 213b is shaped such that it wraps about the signaling via 212b and generally follows the trace 214b (FIG. 2B) and the trace 220b.

Therefore, in comparison to the right circular cylindrical ground/power vias 113 of FIG. 1 discussed above, the continuous slot vias 213 lack the intrinsic gaps that exist between immediately adjacent ones of the right circular cylindrical ground/power vias 113 of FIG. 1. For example, from the perspective of the signaling via 212b, the slot via 213a continuously spans a full diameter D of the signaling via 212a and/or continuously wraps about a large portion of the perimeter or circumference of the signaling via 212a (e.g., such that there is no direct path through the intermediary layer 223 from the signaling via 212b to the signaling via 212a without first going a relatively large distance in a direction generally away from the signaling via 212a, navigating around an end of the slot via 213a within the intermediary layer 223, and significantly doubling back in a direction toward the signaling via 212a). In other words, the slot via 213a continuously walls off the first signaling via 212a from the second signaling via 212b, and vice versa. Thus, as shown by the arrows 234 in FIG. 2C, the continuous slot via 213a prevents crosstalk through the continuous slot via 213a (e.g., within the intermediary layer 223) between data signals routed along the signaling vias 212. In other words, in comparison to the separate right circular cylindrical vias 113 of FIG. 1, the continuous slot via 213a better shields data signals routed along the signaling vias 212 from crosstalk with one another, especially as transmission speeds of the data signals increase.

By using continuous slot vias 213 instead of the right circular cylindrical ground/power vias 113 of FIG. 1, a greater amount of the material (e.g., prepreg, dielectric) used to form the intermediary layer 223 of the substrate 201 is replaced by conductive material (e.g., copper) used to form the continuous slot vias 213. As such, it is expected that the substrates incorporating continuous slot vias of the present technology exhibit greater thermal flow out of the substrate 201 (e.g., heat dissipation) than substrates incorporating the right circular cylindrical ground/power vias 113 of FIG. 1. In some embodiments, a slot via 213 can extend to and/or be exposed through an edge of the intermediary layer 223 and/or of the substrate 201. By extending a slot via 213 to (and exposing the slot via 213 through) an edge of the intermediary layer 223 and/or the substrate 201, the slot via 213 is expected to improve thermal flow out of the intermediary layer 223 and/or the substrate 201 (e.g., by enabling a connection to a heat sink or other structure at the edge, enabling heat to be transferred along the slot via 213 from a more central location in the substrate 201 to the edge of the substrate 201). Moreover, the continuous slot vias 213 facilitate power/ground vertical coupling to data signals transmitted along nearby signaling vias 212. Therefore, the continuous slot vias 213 are expected to provide more optimal power/ground referencing to the data signals than is provided by the right circular cylindrical ground/power vias 113 of FIG. 1.

Although shown as only shielding the signaling vias 212a and/or 212b in FIGS. 2B and 2C, the slot vias 213a and/or 213b can be sized and/or shaped to shield other signaling vias 212 extending through the intermediary layer 223. For example, the size and/or shape of a slot via 213 (e.g., the slot via 213a and/or the slot via 213b) can enable or configure the continuous slot via 213 to shield (i) data signals transmitted along more than one pair of immediately adjacent signaling vias 212 from crosstalk with one another and/or (ii) data signals transmitted along two non-immediately-adjacent signaling vias 212 from crosstalk with one another.

In the embodiment illustrated in FIGS. 2B and 2C, the widths W1 and W2 of the slot vias 213 are identical or generally similar to the diameters D of the signaling vias 212. Additionally, the heights H1 and H2 of the slot vias 213 are identical or generally similar to the heights H of the signaling vias 212. Thus, for example, the slot vias 213 can extend an identical or similar distance vertically through the intermediary layer 223 (FIG. 2A) of the substrate 201 as the signaling vias 212. Furthermore, the widths W1 and W2 and the heights H1 and H2 of the slot vias 213 remain generally uniform along the respective lengths L1 and L2 of the slot vias 213.

In other embodiments, the widths W1, W2 and/or the heights H1, H2 of the slot vias 213 can (a) differ from the diameters D and/or the heights H, respectively, of the signaling vias 212, and/or (b) vary along the respective lengths L1 and L2 of the slot vias 213. Vias other than slot vias can be used (e.g., to shield data signals from crosstalk) in addition to or in lieu of the slot vias 213 in other embodiments of the present technology. For example, a via can be sized and/or shaped such that it has a two-dimensional spread (e.g., generally along the x-y plane) across the intermediary layer 223 constrained by (a) electrical structures (e.g., vias, traces, etc.) within the intermediary layer 223 (FIG. 2A) and/or (b) the size of the intermediary layer 223 and/or the substrate 201. As a specific example, a via can be sized and/or shaped such that it spreads laterally across the intermediary layer 223 (e.g., in the x-y plane, in directions generally parallel to the first signal layer 221 and/or the second signal layer 222) (a) up to, around, or between other electrical structures within the intermediary layer 223 (e.g., by tapering the width and/or length of the via where needed to avoid contacting the other electrical structures, expanding the width and/or length of the slot via 213b where available in the absence of other electrical structures), (b) until the via merges with (e.g., is electrically coupled to) other shielding vias or similar structures within the intermediary layer 223, and/or (c) until the via reaches (e.g., meets, approaches) one or more edges of the intermediary layer 223 and/or the substrate 201. In these embodiments, the via can resemble a plane more so than a slot.

As another example, the height of a slot via 213 can be greater than, less than, or equal to (a) the height of the intermediary layer 223 (FIG. 2A) of the substrate 201 and/or (b) the heights of the signaling vias 212. As a specific example, a first portion of a slot via 213 can have a first height such that the first portion of the slot via 213 extends vertically all the way through the intermediary layer, and/or a second portion of the slot via 213 can have a second height such that the second portion of the slot via 213 extends vertically only a part of the way through the intermediary layer. Continuing with this example, the first height can be similar to or greater than the heights of the signaling vias 212, and the second height can be less than the heights of the signaling vias 212.

As shown in FIGS. 2B and 2C, the electrical contacts 215 and 217 are generally sized and shaped to match or correspond to the size and shape of the respective slot via 213. More specifically, the illustrated electrical contacts 215 and 217 have widths and lengths that are slightly larger than the widths W1, W2 and the lengths L1, L2 of the corresponding slot via 213. The slightly larger sizes of the electrical contacts 215 and 217 can facilitate forming electrical connections between (a) the electrical contacts 215 and 217 and (b) the corresponding slot vias 213. Such electrical connections can be continuous, for example, along (i) the lengths L1, L2 of the slot vias 213 and/or (ii) a top and/or bottom surface of the slot vias 213 facing the first signal layer 221 (FIG. 2A) and/or the second signal layer 222 (FIG. 2A), respectively. Alternatively, a slot via 213 can be coupled to the corresponding electrical contact 215 and/or to the corresponding electrical contact 217 at only select positions along the slot via 213 such that the slot via 213 is discontinuously coupled to the corresponding electrical contact 215 and/or to the corresponding electrical contact 217, for example, along (i) the lengths L1, L2 of the slot vias 213 and/or (ii) a top and/or bottom surface of the slot vias 213 facing the first signal layer 221 and/or the second signal layer 222, respectively. As discussed above, the electrical connections facilitate transmitting ground signals and/or power signals between the electrical contacts 215 and the electrical contacts 217 along the corresponding slot vias 213.

In other embodiments, the electrical contacts 215 and 217 can have widths and/or lengths that are identical or generally similar to the width and/or lengths of a slot via 213. For example, while a slot via 213 may spread laterally across the intermediary layer 223 (FIG. 2A) similar to a plane and consistent with the discussion above, the corresponding electrical contacts 215 and/or 217 can also spread laterally across the substrate 201 (e.g., in the x-y plane) in a similar manner and/or such that the electrical contacts 215 and/or 217 overlap and/or are couple to the slot via 213 along a majority or entirety of the slot via 213. In still other embodiments, the electrical contacts 215 and 217 can have widths and/or lengths smaller (e.g., significantly smaller) than a corresponding slot via 213. For example, although a slot via 213 may spread laterally across the intermediary layer 223 (FIG. 2A) consistent with the discussion above, the corresponding electrical contacts 215 and/or 217 can be sized and/or shaped (e.g., like islands) to be much smaller and/or such that the electrical contacts 215 and/or 217 overlap and/or are coupled to the slot via 213 at only select areas of the slot via 213.

Referring again to the embodiment illustrated in FIGS. 2B and 2C, various methods may be employed to form the signaling vias 212 and the slot vias 213 of the present technology. A signaling via 212 of the present technology can be formed by drilling or creating a hole (e.g., using a laser or another method) through the intermediary layer 223 (FIG. 2A) of the substrate 201 (e.g., until the hole reaches a corresponding electrical contact 218 in the second signal layer 222), and then filling the hole with a conductive material (e.g., copper or another suitable material), thereby forming the signaling via 212. In other embodiments, a signaling via 212 can be formed by 3D-printing or growing up the intermediary layer 223 (e.g., on top of the second signal layer 222 of FIG. 2A) to include a hole corresponding to the signaling via, and then filling the hole with conductive material (e.g., copper or another suitable material) to form the signaling via 212. In still other embodiments, a signaling via 212 can be formed by 3D-printing or growing up the signaling via 212 (e.g., on top of a corresponding electrical contact 218 of the second signal layer 222 of the substrate 201) with a conductive material (e.g., copper or another suitable material), and then filling the space about the signaling via 213 with material (e.g., prepreg, dielectric) to form at least part of the intermediary layer 223 of the substrate.

By contrast, a slot via 213 can be formed by creating a slot (e.g., trench, trough) in the intermediary layer 223 of the substrate 201 (e.g., until the slot reaches the corresponding electrical contact 217), and then filling the slot with a conductive material (e.g., copper or another suitable material), thereby forming the slot via 213. The slot can be created by drilling or otherwise removing the intermediary layer 223 (e.g., using a laser or another method). For example, a laser (e.g., a same laser used to drill holes for the signaling vias 212) can be used to form the slots for the slot vias by (a) drilling through the intermediary layer 223 to form a hole, (b) stopping the laser, (c) repositioning the substrate 201 and/or the laser such that a next drilling of a hole into the intermediary layer 223 using the laser at least partially overlaps the last hole drilled by the laser into the intermediary layer 223, (d) again drilling a hole through the intermediary layer 223, and (d) repeating steps (b)-(d) until a slot with a desired shape and dimensions is formed in the intermediary layer 223. As another example, a laser (e.g., a same laser used to drill holes for the signaling vias 212) can be used to form the slots for the slot vias by (i) drilling through the intermediary layer 223 to form a hole, and (ii) creating a slot with a desired shape and dimension by dragging the intermediary layer 223 of the substrate 201 across the laser and/or by dragging the laser across the intermediary layer 223 without turning the laser off. As still another example, a laser with a larger beam width than the beam width of the laser used to form the signaling vias 212, and/or multiple lasers arranged generally along the desired position of at least a portion of a slot via 213 can be used to form the slot. After forming the slot in the intermediary layer 223, the slot can then be filled with conductive material (e.g., copper or another suitable material) to form the continuous slot via 213.

In other embodiments, a continuous slot via 213 can be formed by 3D-printing or growing up the intermediary layer 223 (e.g., on top of the second signal layer 222 of FIG. 2A) to include a slot corresponding to the slot via 213, and then filling the hole with conductive material (e.g., copper or another suitable material) to form the slot via 213. In still other embodiments, a slot via 213 can be formed by 3D-printing or growing up the slot via 213 (e.g., on top of a corresponding electrical contact 217 of the second signal layer 222 of the substrate 201) with a conductive material (e.g., copper or another suitable material), and then filling the space about the slot via 213 with material (e.g., prepreg, dielectric) to form at least part of the intermediary layer 223 of the substrate.

Figure 3:
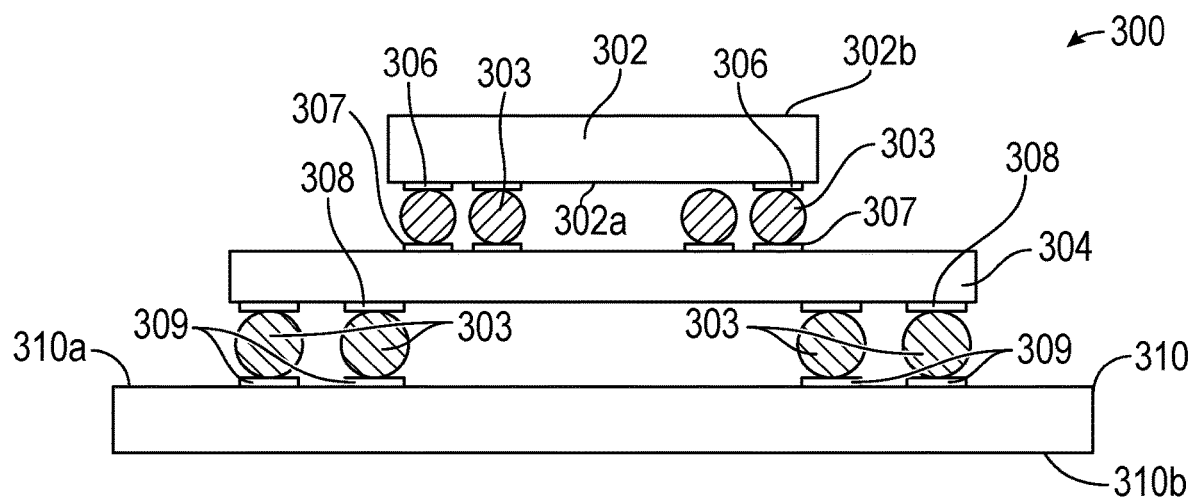
FIG. 3 is a partially schematic side view of a semiconductor device configured in accordance with various embodiments of the present technology.

FIG. 3 is a partially schematic side view of a semiconductor device 300 ("the device 300") configured in accordance with various embodiments of the present technology. As shown, the device 300 includes a printed circuit board (PCB) 310, an electronic device or semiconductor die 302, and a package substrate 304 coupling the semiconductor die 302 to the PCB 310. In some embodiments, the device 300 can be provided as part of a larger system. For example, the device 300 can be provided as part of a system (e.g., a computing system or another component) of a mobile device, an automotive device, a computing device, a toy, and/or another device or system.

The PCB 310 of FIG. 3 includes a first side 310a (e.g., a first surface or a first face) and a second side 310b (e.g., a second surface or a second face). A plurality of electrical contacts 309 are disposed on (or exposed through) the first side 310a of the PCB 310. The electrical contacts 309 can be bond pads, bond fingers, and/or other suitable electrical contacts or connectors. Various ones of the electrical contacts 309 can receive data signals and/or various other ones of the electrical contacts 309 can receive power and/or ground signals.

Although not shown in FIG. 3, the PCB 310 further includes a network of electrical connectors (e.g., conductive traces, planes, wires, vias, printed conductive lines, etc.) extending therethrough and/or thereacross. The network of electrical connectors can be configured to electrically couple the PCB 310, the package substrate 304, and/or the semiconductor die 302 to external circuitry and/or other components (e.g., a controller, a processor, a host device, etc.) of a system incorporating the device 300. In some embodiments, the network of electrical connectors can include electrical contacts (not shown) disposed on (or exposed through) the second side 310b of the PCB 310 (e.g., similar to the electrical contacts 309).

In some embodiments, the PCB 310 can include a substrate generally similar to the substrate 201 of FIGS. 2A-2C. For example, the PCB 310 can include a plurality of layers, such as signal layers, plane layers, and/or intermediary layers positioned between the signal layers and/or the plane layers. The PCB 310 can further include a plurality of signaling vias and at least one continuous slot via positioned between immediately adjacent ones of the plurality of signaling vias (e.g., to shield data signals transmitted along the signaling vias from one another).

As shown in FIG. 3, the semiconductor die 302 includes an active side 302a (e.g., an active surface or an active face) having a plurality of electrical contacts 306. The electrical contacts 306 can be bond pads, bond fingers, and/or other suitable electrical contacts or connectors. Various ones of the electrical contacts 306 can receive data signals and/or various other ones of the electrical contacts 306 can receive power and/or ground signals.

The semiconductor die 302 of FIG. 3 is positioned over (e.g., on top of) the package substrate 304 and is illustrated in a face-down orientation. In other embodiments, the semiconductor die 302 can be arranged in a face-up orientation, and/or the semiconductor die 302 can include one or more electrical contacts (not shown) on a side 302b (e.g., on a surface or on a face) opposite the active side 302a of the memory die 302.

The semiconductor die 302 can include various types of semiconductor components and functional features, such as dynamic random-access memory (DRAM), static random-access memory (SRAM), flash (e.g., NAND or NOR) memory, or other forms of integrated circuit memory, processing circuitry, imaging components, and/or other semiconductor features. In one embodiment, the semiconductor die 302 is a memory die. Additionally, or alternatively, the semiconductor die 302 can embody a variety of alternative integrated circuit functions. Furthermore, although only one semiconductor die 302 is included in the embodiment illustrated in FIG. 3, semiconductor devices configured in accordance with other embodiments of the present technology can include a greater number (e.g., more than one) of semiconductor dies 302. The plurality of semiconductor dies 302 can be arranged side-by-side on the package substrate 304, and/or the semiconductor dies 302 can be stacked such that at least one of the semiconductor dies 302 is placed on top of another of the semiconductor dies 302.

In some embodiments, the semiconductor die 302 can include a substrate generally similar to the substrate 201 of FIGS. 2A-2C. For example, the semiconductor die 302 can include a plurality of layers, such as signal layers, plane layers, and/or intermediary layers positioned between the signal layers and/or the plane layers. The semiconductor die 302 can further include a plurality of signaling vias and at least one continuous slot via positioned between immediately adjacent ones of the plurality of signaling vias (e.g., to shield data signals transmitted along the signaling vias from one another).

The package substrate 304 of FIG. 3 includes a plurality of electrical contacts 307 disposed on (or exposed through) a top side of the package substrate 304, and a plurality of electrical contacts 308 disposed on (or exposed through) bottom side of the package substrate 304. The electrical contacts 307 and/or the electrical contacts 308 can be bond pads, bond fingers, and/or other suitable electrical contacts or connectors. Various ones of the electrical contacts 307 and/or 308 can receive data signals and/or various other ones of the electrical contacts 307 and/or 308 can receive power and/or ground signals. The package substrate 304 further includes a network (not shown) of electrical connectors (e.g., conductive traces, vias, planes, wires, printed conductive lines, etc.) configured to electrically couple the semiconductor die 302 to the PCB 310.

In the illustrated embodiment, the package substrate 304 is shown positioned between the semiconductor die 302 and the PCB 310. A plurality of electrical connectors 303 (e.g., solder balls, conductive pillars, and/or other suitable electrical connectors, such as wire bonds) can be used (i) to electrically couple the electrical contacts 306 on the active side 302a of the semiconductor die 302 to respective ones of the plurality of electrical contacts 307 on the top side of the package substrate 304, and/or (ii) to electrically couple the electrical contacts 308 on the bottom side of the package substrate 304 to respective ones of the plurality of electrical contacts 309 on the first side 310a of the PCB 310. This can facilitate electrical communication between the semiconductor die 302 and the PCB 310 via the package substrate 304.

In some embodiments, the package substrate 304 can include a substrate generally similar to the substrate 201 of FIGS. 2A-2C. For example, the package substrate 304 can include a plurality of layers, such as signal layers, plane layers, and/or intermediary layers positioned between the signal layers and/or the plane layers. The package substrate 304 can further include a plurality of signaling vias and at least one continuous slot via positioned between immediately adjacent ones of the plurality of signaling vias (e.g., to shield data signals transmitted along the signaling vias from one another).

Figure 4:
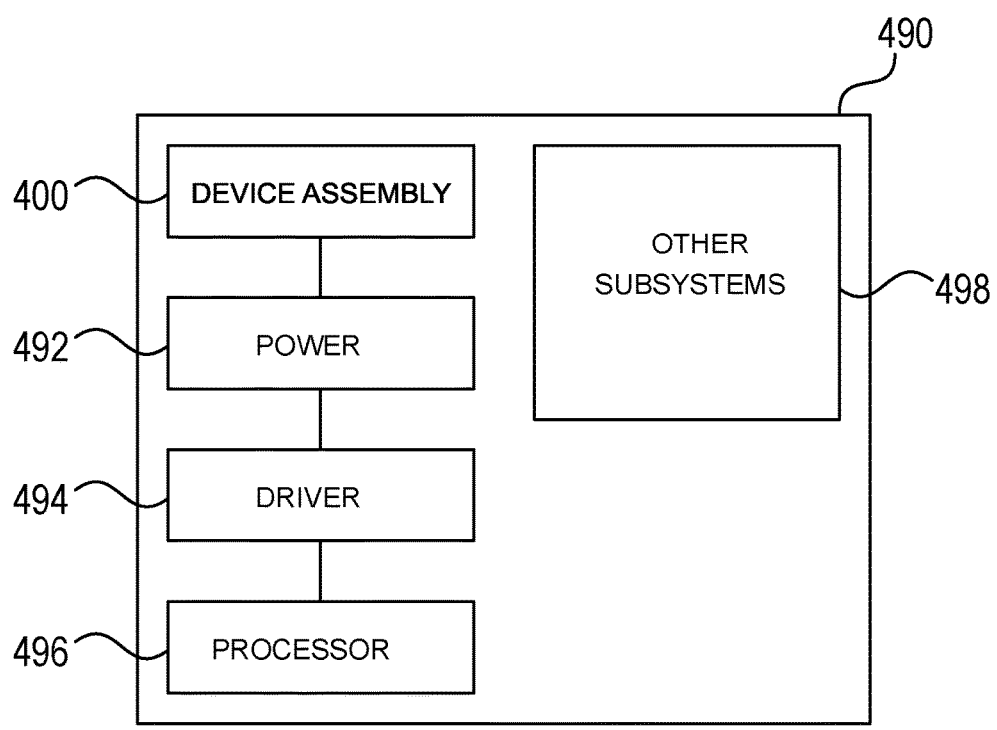
FIG. 4 is a schematic view of a system that includes a semiconductor device configured in accordance with various embodiments of the present technology.

Any of the substrates and/or semiconductor devices described above with reference to FIGS. 1-3 can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems or components 498. The semiconductor device assembly 400 can include semiconductor devices with features generally similar to those of the substrates and/or semiconductor devices described above. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, and appliances. Components of the system 490 may be housed in a single unit or distributed over multiple, interconnected units (e.g., through a communications network). The components of the system 490 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same feature(s) and/or additional types of other features are not precluded. Moreover, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. As another example, various components of the technology can be further divided into subcomponents, and/or various components and/or functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the present technology.

It should also be noted that other embodiments in addition to those disclosed herein are within the scope of the present technology. For example, embodiments of the present technology can have different configurations, components, and/or procedures in addition to those shown or described herein. Moreover, a person of ordinary skill in the art will understand that these and other embodiments can be without several of the configurations, components, and/or procedures shown or described herein without deviating from the present technology. Accordingly, the disclosure and associated technology can encompass other embodiments not expressly shown or described herein.

What is claimed is:

1. A substrate, comprising:
    a first design layer, a second design layer, and an intermediary layer positioned between the first design layer and the second design layer;
    a first signaling via extending vertically through the intermediary layer between the first design layer and the second design layer, the first signaling via configured to route first data signals between the first design layer and the second design layer;
    a second signaling via extending vertically through the intermediary layer between the first design layer and the second design layer, the second signaling via configured to route second data signals between the first design layer and the second design layer;
    a first trace extending laterally across the first design layer and coupled to the first signaling via;
    a second trace extending laterally across the first design layer and coupled to the second signaling via;
    a slot via extending vertically at least partially through the intermediary layer between the first design layer and the second design layer;
    a first capture pad; and
    a second capture pad,
    wherein the slot via extends from the first capture pad to the second capture pad through the intermediary layer, is positioned within the intermediary layer between the first signaling via and the second signaling via, and extends laterally within the intermediary layer along a path that passes between the first signaling via and the second signaling via, and
    wherein the first capture pad and/or the slot via is shaped such that the first capture pad and/or the slot via at least partially tracks the first trace, the second trace, or a combination thereof.

2. The substrate of claim 1, wherein the path corresponds to an elongated lateral dimension of the slot via.

3. The substrate of claim 2, wherein the slot via is continuous along the path such that the slot via shields the first and second data signals from crosstalk with one another while the first and second data signals are transmitted along the first and second signaling vias, respectively.

4. The substrate of claim 1, wherein the slot via has a different shape from the first signaling via, the second signaling via, or a combination thereof.

5. The substrate of claim 1, wherein at least a portion of a cross section of the slot via in a direction parallel to the first design layer and/or the second design layer is arcuate.

6. The substrate of claim 1, wherein the slot via is configured to receive ground signals or power signals.

7. The substrate of claim 1, wherein:
    the substrate further comprises—
        a third trace extending laterally across the second design layer and coupled to the first signaling via, and
        a fourth trace extending laterally across the second design layer and coupled to the second signaling via; and
    the second capture pad and/or the slot via is shaped such that the second capture pad and/or the slot via tracks the third trace, the fourth trace, or a combination thereof.

8. The substrate of claim 1, wherein the slot via is continuously coupled to the first capture pad along a length of the slot via measured from one end of the slot via to another, is continuously coupled to the second capture pad along the length of the slot via, or a combination thereof.

9. The substrate of claim 1, wherein the slot via is coupled to the first capture pad, the second capture pad, or a combination thereof at only select positions along a length of the slot via measured from one end of the slot via to another, such that the slot via is discontinuously coupled to the first capture pad and/or the second capture pad along the length of the slot via.

10. The substrate of claim 1, wherein the slot via extends to and is exposed at an edge of the substrate.

11. The substrate of claim 1, wherein the first signaling via and the second signaling via are immediately adjacent signaling vias to each other in the substrate.

12. The substrate of claim 1, wherein the substrate is a printed circuit board, the intermediary layer includes prepreg or a substrate core, or a combination thereof.

13. An apparatus, comprising:
  a substrate including—
    a first design layer, a second design layer, and an intermediary layer positioned between the first design layer and the second design layer,
    a first signaling via extending vertically through the intermediary layer between the first design layer and the second design layer, the first signaling via configured to route first data signals between a first electrical contact at the first design layer and a second electrical contact at the second design layer,
    a second signaling via extending vertically through the intermediary layer between the first design layer and the second design layer, the second signaling via configured to route second data signals between the first design layer and the second design layer,
    a slot via extending vertically at least partially through the intermediary layer between the first design layer and the second design layer,
    a first capture pad, and
    a second capture pad,
    wherein the slot via extends from the first capture pad to the second capture pad through the intermediary layer, is positioned within the intermediary layer between the first signaling via and the second signaling via, and extends laterally within the intermediary layer along a path that passes between the first signaling via and the second signaling via, and
    wherein the slot via is coupled to the first capture pad, the second capture pad, or a combination thereof at only select positions along a length of the slot via measured from one end of the slot via to another, such that the slot via is discontinuously coupled to the first capture pad and/or the second capture pad along the length of the slot via; and
  an electronic device mounted on the substrate and electrically coupled to (a) the first electrical contact such that the electronic device is configured to transmit or receive the first data signals, (b) the slot via such that the electronic device is configured to transmit or receive ground or power signals, or (c) a combination thereof.

14. The apparatus of claim 13, wherein the first signaling via and the second signaling via are immediately adjacent signaling vias to each other in the substrate.

15. A substrate, comprising:
  a first design layer, a second design layer, and an intermediary layer positioned between the first design layer and the second design layer;
  a first signaling via extending vertically through the intermediary layer between the first design layer and the second design layer, the first signaling via configured to route first data signals between the first design layer and the second design layer;
  a second signaling via extending vertically through the intermediary layer between the first design layer and the second design layer, the second signaling via configured to route second data signals between the first design layer and the second design layer;
  a slot via extending vertically at least partially through the intermediary layer between the first design layer and the second design layer;
  a first capture pad; and
  a second capture pad,
  wherein the slot via extends from the first capture pad to the second capture pad through the intermediary layer, is positioned within the intermediary layer between the first signaling via and the second signaling via, and extends laterally within the intermediary layer along a path that passes between the first signaling via and the second signaling via, and
  wherein the slot via is continuously coupled to the first capture pad along a length of the slot via measured from one end of the slot via to another, is continuously coupled to the second capture pad along the length of the slot via, or a combination thereof.

16. The substrate of claim 15, wherein the path corresponds to an elongated lateral dimension of the slot via, and wherein the slot via is continuous along the path such that the slot via shields the first and second data signals from crosstalk with one another while the first and second data signals are transmitted along the first and second signaling vias, respectively.

17. The substrate of claim 15, wherein the slot via is configured to receive ground signals or power signals.

18. The substrate of claim 15, wherein the slot via extends to and is exposed at an edge of the substrate.

19. The substrate of claim 15, wherein the first signaling via and the second signaling via are immediately adjacent signaling vias to each other in the substrate.

20. The substrate of claim 15, wherein the substrate is a printed circuit board, the intermediary layer includes prepreg or a substrate core, or a combination thereof.

* * * * *